United States Patent
Liu et al.

(10) Patent No.: US 10,872,830 B2
(45) Date of Patent: Dec. 22, 2020

(54) POWER SEMICONDUCTOR MODULE WITH SHORT CIRCUIT FAILURE MODE

(71) Applicant: ABB Schweiz AG, Baden (CH)

(72) Inventors: Chunlei Liu, Oberrohrdorf (CH); Juergen Schuderer, Zürich (CH); Franziska Brem, Küsnacht (CH); Munaf Rahimo, Gänsbrunnen (CH); Peter Karl Steimer, Ehrendingen (CH); Franc Dugal, Benglen (CH)

(73) Assignee: ABB Schweiz AG, Baden (CH)

( * ) Notice: Subject to any disclaimer, the term of this patent is extended or adjusted under 35 U.S.C. 154(b) by 0 days.

(21) Appl. No.: 16/529,295

(22) Filed: Aug. 1, 2019

(65) Prior Publication Data

US 2019/0355634 A1 Nov. 21, 2019

Related U.S. Application Data

(63) Continuation of application No. PCT/EP2018/052559, filed on Feb. 1, 2018.

(30) Foreign Application Priority Data

Feb. 1, 2017 (EP) .................................... 17154197

(51) Int. Cl.
*H01L 27/06* (2006.01)
*H01L 31/02* (2006.01)
(Continued)

(52) U.S. Cl.
CPC .......... *H01L 23/051* (2013.01); *H01L 23/492* (2013.01); *H01L 23/62* (2013.01);
(Continued)

(58) Field of Classification Search
CPC ..... H01L 23/051; H01L 23/535; H01L 23/62; H01L 25/07; H01L 29/16; H01L 23/00; H01L 23/492
(Continued)

(56) References Cited

U.S. PATENT DOCUMENTS 6,426,561 B1 7/2002 Lang et al.
2004/0188706 A1* 9/2004 Chang ..................... H01L 25/18
257/177
(Continued)

FOREIGN PATENT DOCUMENTS

EP 0989611 A2 3/2000
EP 2503595 A1 9/2012
(Continued)

OTHER PUBLICATIONS

European Patent Office, International Search Report & Written Opinion issued in corresponding Application No. PCT/EP2018/052559, dated May 4, 2018, 11 pp.

*Primary Examiner* — Sheikh Maruf
(74) *Attorney, Agent, or Firm* — Slater Matsil, LLP

(57) ABSTRACT

A power semiconductor device includes a base plate; a Si chip including a Si substrate, the Si chip attached to the base plate; a first metal preform pressed with a first press pin against the Si chip; a wide bandgap material chip comprising a wide bandgap substrate and a semiconductor switch provided in the wide bandgap substrate, the wide bandgap material chip attached to the base plate; and a second metal preform pressed with a second press pin against the wide bandgap material chip; the Si chip and the wide bandgap material chip are connected in parallel via the base plate and via the first press pin and the second press pin; the first metal preform is adapted for forming a conducting path through the Si chip, when heated by an overcurrent; and the second metal preform is adapted for forming an temporary conduct- (Continued)

ing path through the wide bandgap material chip or an open circuit, when heated by an overcurrent.

20 Claims, 2 Drawing Sheets

(51) Int. Cl.
*H01L 31/18* (2006.01)
*H01L 23/051* (2006.01)
*H01L 23/492* (2006.01)
*H01L 23/62* (2006.01)
*H01L 23/00* (2006.01)
*H01L 25/07* (2006.01)
*H01L 29/16* (2006.01)

(52) U.S. Cl.
CPC ............. *H01L 24/29* (2013.01); *H01L 24/48* (2013.01); *H01L 24/72* (2013.01); *H01L 25/072* (2013.01); *H01L 29/1608* (2013.01); *H01L 2224/48091* (2013.01); *H01L 2224/48105* (2013.01); *H01L 2224/48249* (2013.01); *H01L 2224/72* (2013.01); *H01L 2224/73201* (2013.01); *H01L 2924/13055* (2013.01)

(58) Field of Classification Search
USPC .......................................................... 257/688
See application file for complete search history.

(56) References Cited

U.S. PATENT DOCUMENTS

| | | | |
|---|---|---|---|
| 2014/0185346 A1* | 7/2014 | Liu | H03K 17/127 363/131 |
| 2015/0145111 A1* | 5/2015 | Mengel | H01L 21/56 257/675 |
| 2017/0229427 A1* | 8/2017 | Rahimo | H01L 29/7802 |
| 2017/0301614 A1* | 10/2017 | Kimura | H01L 24/32 |
| 2017/0338190 A1* | 11/2017 | Fujino | H01L 25/072 |
| 2019/0131210 A1* | 5/2019 | Hino | H01L 25/072 |
| 2019/0333838 A1* | 10/2019 | Nawaz | H01L 25/072 |

FOREIGN PATENT DOCUMENTS

| | | |
|---|---|---|
| EP | 2530711 A1 | 12/2012 |
| WO | 2012107482 A2 | 8/2012 |
| WO | 2013004297 A1 | 1/2013 |
| WO | 2016062426 A1 | 4/2016 |

* cited by examiner

POWER SEMICONDUCTOR MODULE WITH SHORT CIRCUIT FAILURE MODE

FIELD OF THE INVENTION

The invention relates to the field of power semiconductor devices. In particular, the invention relates to a power semiconductor module for such a device.

BACKGROUND OF THE INVENTION

Power semiconductor devices such as converters, electrical drives, STATCOMS, etc. are usually assembled of a plurality of power semiconductor modules, each of which mechanically and electrically connects one or more power semiconductor elements. In high voltage DC applications, a series connection of multiple power semiconductor modules is usually required to fulfil high voltage and high current requirements. A power semiconductor module that in case of a failure becomes permanently conducting may have great advantages in such series connections.

In semiconductor modules with a Si (silicon) based semiconductor element, a metal preform may be provided on an electrode of a Si chip which is adapted to form a low melting eutectic alloy with the Si material of the chip and which creates a conducting path to carry the full current load through the failure point. For example, the eutectic reaction between Si and Al (aluminium) at a relative low temperature (577° C.) enables such an intrinsic failure compensation.

For example, EP 0989611 A2 and EP 2 503 595 A1 relate to a power semiconductor module with a semiconductor chip based on Si, which is provided between two layers that are capable of forming an eutectic alloy with the Si material of the chip.

Due to their high blocking capabilities, semiconductor modules with semiconductor elements based on SiC (silicon carbide) and other wide bandgap substrates are more and more employed in high voltage applications.

WO 2016/062 426 A1 shows a semiconductor module with a parallel connection of a Si chip 12 and a SiC chip. A press device is used for pressing onto the Si chip. It is mentioned that this facilitates the provision of a short circuit failure mode.

WO 2013/004 297 A1 shows a semiconductor module with several semiconductor devices, such as IGBTs, onto which a metal layer is pressed by a resilient element. When melting, the metal layer is adapted for forming an alloy with the material of the semiconductor devices.

WO2012/107 482 A2 shows a semiconductor module with a plurality of silicon based semiconductor chips onto each of which a first preform made of Al and a second preform made of Mo is provided. The forming of a eutectic alloy between the first metal preform and the chips is mentioned.

DESCRIPTION OF THE INVENTION

It is an objective of the invention to provide compact, secure and less complex power semiconductor devices based on wide bandgap semiconductor elements.

This objective is achieved by the subject-matter of the independent claim. Further exemplary embodiments are evident from the dependent claims and the following description.

The invention relates to a power semiconductor module. Here and in the following, the term "power" may relate to the ability to process currents of more than 10 A and/or more than 1.000 V. A power semiconductor module in general may be a device mechanically supporting and providing terminals for one or more power semiconductor elements such as transistors, thyristors, diodes, etc. In general, a power semiconductor module may comprise a housing providing the terminals, in which the one or more power semiconductor elements are accommodated.

According to an embodiment of the invention, the power semiconductor module comprises a base plate, which may be completely electrically conducting or at least comprises an electrically conducting layer.

Furthermore, the power semiconductor module comprises a Si chip comprising a Si substrate, the Si chip attached to the base plate and a first metal preform pressed with a first press pin against a side of the Si chip. For example, the Si chip may be welded, sintered or soldered to the base plate. The first metal preform may be directly pressed against the Si chip. It has to be noted that a bonding layer for bonding the first metal preform to the Si chip and/or an electrode layer on the Si chip may be seen as part of the Si chip. The first press pin may be of a different material as the first metal preform.

The power semiconductor module also comprises a wide bandgap material chip comprising a wide bandgap substrate and a semiconductor switch provided in the wide bandgap substrate, the wide bandgap material chip attached to the base plate and a second metal preform pressed with a second press pin against a side of the wide bandgap material chip. For example, the Si chip may be welded, sintered or soldered to the base plate. The second metal preform may be directly pressed against the wide bandgap material chip. It has to be noted that a bonding layer for bonding the second metal preform to the wide bandgap material chip and/or an electrode layer on the wide bandgap chip may be seen as part of the wide bandgap material chip. The second press pin may be of a different material as the second metal preform.

A wide bandgap material may be SiC, GaN, etc. It may be characterized with a semiconductor bandgap of at least 2 eV.

A semiconductor switch may be a switching element with a gate that is adapted for controlling a resistance between two further electrodes of the semiconductor switch. Semiconductor switches may be transistors and thyristors. For example, the wide bandgap material of the wide bandgap material switch may be SiC. For example, the semiconductor switch may be a SiC MOSFET, SiC JFET, SiC IGBT, SiC BJT or SiC GTO.

The first metal preform and/or the second metal preform may be plate-like bodies with two planar surfaces. The first metal preform and/or the second metal preform may be thicker than the corresponding chip.

The Si chip and/or the wide bandgap material chip may both have substantially plate-like bodies with flat electrodes provided on both sides. On the side facing and/or abutting the metal preform, also a gate electrode for a switch provided by the respective chip may be present.

The Si chip and the wide bandgap material chip are electrically connected in parallel via the base plate and via the first press pin and the second press pin. In particular, they are connected in parallel within the power semiconductor module. It may be that a top plate closes the circuit with the first press pin and the second press pin. It has to be noted that the Si chip may be a completely passive element and/or layer only providing a rather high resistance for the current path along the first metal preform and the first press pin. I.e. it may be that during normal operation no current flows through the Si chip at all.

The first metal preform is adapted for forming, optionally together with the Si substrate, a conducting path through the Si chip, when heated by an overcurrent. The conducting path may be formed with an alloy, which is formed from the material of the first metal preform and the Si substrate. Besides Al, also other metals may be adapted for forming a eutectic alloy with Si. Here, an overcurrent may be a current so high that the Si chip and/or for example the first metal preform melts or starts to melt.

The second metal preform is adapted for forming with the wide bandgap substrate an at least temporary conducting path through the wide bandgap material chip, when heated by an overcurrent. In this context, the overcurrent may be a current so high that the second metal preform and/or the wide bandgap material starts to melt. The second metal preform is made of a material with a higher melting point as a material of the first metal preform. In such a way, the second metal preform may account for the higher melting point of the wide bandgap material, compared to the melting point of the Si material of the Si chip.

With this construction, the Si chip and the first metal preform may provide a permanent SCFM (short circuit failure mode), while the wide bandgap material chip and the second metal preform may provide a temporary conducting path or even an open circuit.

The semiconductor module may be series-connected, for example by stacking, with other semiconductor modules, which may be of the same type as the semiconductor module described therein. In the case, the wide bandgap material chip fails, it may become blocking or may have at least a much higher resistance as the other semiconductor modules. Therefore, the voltage across the series-connected semiconductor modules may be completely or substantially applied to the semiconductor module with the failed chip, which may cause an arc and overcurrent through the wide bandgap material chip.

A temporary conducting path through the wide bandgap material chip is formed, which, however, may degrade due to the materials formed for the conducting path. For example, a SiC substrate and a metal preform may form electrically conducting substances, which are not stable and vanish after some time. The term "temporary" may relate to a time span much smaller than a "permanent" time span. For example a temporary time span may be shorter than 1 second.

According to an embodiment of the invention, the second metal preform is adapted for forming an at least temporary conducting path through the wide bandgap material chip by being melted by the overcurrent. The second metal preform may be heated to such a high temperature by the overcurrent, such that itself and/or the wide bandgap material melts and a conducting path of conducting material is formed through the wide bandgap material chip. The Si chip and the first metal preform may form a permanent electrically conduction path. It has to be noted that the term "permanent" refers to a time span that is much longer than a "temporary" time span, for example by a factor of 100 or more. The formation of the permanent electrically conducting path through the Si chip may be due to solely the voltage across the Si chip, as described with respect to the wide bandgap material chip. However, it also may be possible that a switch in the Si chip is provided with a gate voltage causing an internal resistance of the Si chip resulting in heating to a suitable temperature for forming the conducting path.

Summarized, in the case of a fault in a wide bandgap material chip, the Si chip and its metal preform may fall easier into a safe short circuit failure mode than the wide bandgap material chip. The Si chip may be seen as a sacrificial device, which provides an intrinsic safety feature of the power semiconductor module.

The resulting wide bandgap-Si semiconductor module may have the advantages of using the low loss wide bandgap material chips during normal operation, and may have the advantages of an intrinsic, reliable SCFM capability provided by the Si chip.

In such a way, wide bandgap material based power semiconductor modules may be reliable used in high voltage applications, in which a plurality of power semiconductor modules are connected in series, such as HVDC applications, STATCOM applications, etc. With this type of power semiconductor modules, a better power system design is enabled with lower system costs and higher system efficiency. For example, mechanical bypasses and explosion proof housings may be omitted.

In general, the first and second metal preform may be made of Al (aluminium), Cu (copper), Ag (silver), Mg (magnesium), Mo (molybdenum), W (tungsten) or their combinations, such as alloys thereof. As already mentioned, the second metal preform is made of a material with a higher melting point as a material of the first metal preform. In this case, the second metal preform will melt at a temperature nearer to the melting temperature of the wide bandgap substrate, which may support forming a conductive path through the wide bandgap material. The metal preform with a lower melting point (e.g. Al, Cu, Ag, Mg, etc.) is preferably directed on the top of the Si chip and the metal preform with a higher melting point (Mo, W, etc.) is preferably on the top of the wide bandgap material (such as SiC) chip.

According to an embodiment of the invention, the first metal preform is made of Al, Cu, Ag, Mg or an alloy thereof. For example, Al may form an eutectic alloy with the Si at a rather low temperature.

According to an embodiment of the invention, the second metal preform is made of Mo, W or an alloy thereof. A beneficial combination may be Al for the first metal preform and Mo for the second metal preform, since Mo besides a rather high melting point also has mechanical properties (such as its coefficient of thermal expansion) suited to a wide bandgap material such as SiC.

According to an embodiment of the invention, the base plate is made of Mo. Mo may be beneficial, because it has a similar coefficient of thermal expansion as Si, SiC or other wide bandgap materials. Furthermore, also Mo may form with the wide bandgap substrate of the wide bandgap material chip under higher temperature at least temporary a conducting path. In this case, also the second metal preform may be made of Mo.

The Si chip may be a dummy Si chip or functional Si chip. A dummy Si chip may be a chip that is not switched or only switched in the case of a failure. A functional Si chip may be a Si chip that is switched together with the wide bandgap material chip.

In the case of a functional Si chip, the ratio of conducted current of the Si chip and the wide bandgap material chip may vary according to system design requirements. A functional Si chip may be controlled separately and it functions only when it is needed. The gate unit for Si chip and the wide bandgap material chip may be the same or the Si chip and the wide bandgap material chip may have different gate units.

According to an embodiment of the invention, the Si chip comprises a semiconductor switch provided in the Si substrate. For example, the switch may be a transistor, thyristor, for example an IGBT or IGCT, or a combination thereof in one substrate. In this case, the Si chip may be functional or dummy. It may have a gate connection to an outside terminal or its gate may be disconnected from the electrical circuitry of the power semiconductor module.

According to an embodiment of the invention, a gate of the semiconductor switch of the Si chip is electrically connected in the semiconductor module with a gate of the semiconductor switch of the wide bandgap material chip. It may be that both switches are connected to the same gate control unit. In this case, the Si switch and the wide bandgap switch both may be used for switching the current through the module in a normal operation mode.

According to an embodiment of the invention, a gate of the semiconductor switch of the Si chip is electrically connected to a first gate terminal of the semiconductor module and a gate of the semiconductor switch of the wide bandgap material chip is electrically connected to a second gate terminal of the semiconductor module, such that the semiconductor switch of the Si chip is switchable independently of the semiconductor switch of the wide bandgap material chip. In this case, during normal operation, both switches may be switched analogously. During a failure mode operation, the Si switch may be switched to generate the electrically conducting path. It may be that the Si switch is only switched during the failure mode operation.

According to an embodiment of the invention, a gate of the semiconductor switch of the Si chip is not connected to a gate terminal provided by the semiconductor module. In this case, the Si chip may be a dummy, not used for switching a current through the semiconductor module, neither in normal operation nor in failure mode operation.

According to an embodiment of the invention, the Si chip does not comprise an active switchable switch. An active switch or active switchable switch may be a switch with a gate that, when set to different potentials, may block and allow a current through the switch. For example, the Si chip may comprise a diode. A freewheeling diode connected antiparallel with the switch of the wide bandgap material chip may be used as the SCFM element of the power semiconductor module.

According to an embodiment of the invention, the Si chip is a passive Si layer. A passive Si layer may be an undoped Si layer and/or a Si layer that does not conduct current in both directions during normal operation conditions of the semiconductor module. The Si chip may not comprise a semiconductor device. It also may be possible that the Si chip is only present to provide the Si material for forming the conducting path together with the first metal preform.

It has to be noted that in the cases, where the conducting path through the Si chip is formed only passively (without any switching of a present or not present switch in the Si chip), the thickness of the Si chip may have to be adapted to a voltage, which causes an arc through the Si chip. The arcing resistance of the Si chip may have to be lower than the voltage providable by the series-connected power semiconductor modules.

According to an embodiment of the invention, the power semiconductor module comprises at least two wide bandgap material chips connected in parallel with the Si chip. It may be that the power semiconductor module comprises more than one wide bandgap material chip and/or more than one Si chip. It may be that the SCFM capability of a Si chip is used for a plurality of wide bandgap material chips.

According to an embodiment of the invention, the power semiconductor module further comprises an electrically conducting top plate connected to the first press pin and the second press pin. The top plate may be made of Cu or Al.

According to an embodiment of the invention, the first press pin and/or the second press pin comprises a spring element. For example, the spring element may comprise one or more disc springs, which may be made of an electrically conducting material.

These and other aspects of the invention will be apparent from and elucidated with reference to the embodiments described hereinafter.

BRIEF DESCRIPTION OF THE DRAWINGS

The subject-matter of the invention will be explained in more detail in the following text with reference to exemplary embodiments which are illustrated in the attached drawings.

The reference symbols used in the drawings, and their meanings, are listed in summary form in the list of reference symbols. In principle, identical parts are provided with the same reference symbols in the figures.

DETAILED DESCRIPTION OF EXEMPLARY EMBODIMENTS

Figure 1:
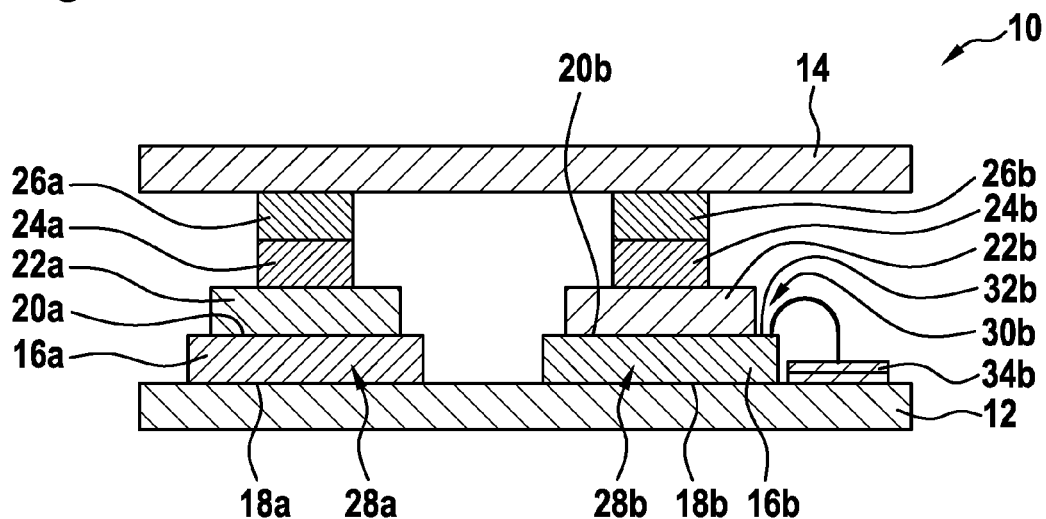
FIG. 1 schematically shows a cross-section through a power semiconductor module according to an embodiment of the invention.

FIG. 1 schematically shows a cross-section through a power semiconductor module 10, which comprises a base plate 12, a top plate 14 and two semiconductor chips 16a, 16b sandwiched between them.

The base plate 12 may be an electrically conducting plate, for example made of Mo. Also, the top plate may be an electrically conducting plate, for example made of Cu or Al.

The first semiconductor chip 16a is a Si chip based on a Si substrate as semiconductor. The second semiconductor chip 16b is a wide bandgap material chip based on a wide bandgap semiconductor substrate, such as SiC.

The first and the second semiconductor chip 16a, 16b may comprise a first and second bottom electrode 18a, 18b and a first and second top electrode 20a, 20b. The terms "top" and "bottom" are not absolute geometrical positions, but are only used to distinguish between two opposite lying electrodes. Every electrode may be provided by a metal layer, which is much thinner than the thickness of the corresponding chip 16a, 16b. Both semiconductor chips 16a, 16b may be attached to the base plate 12, for example by sintering, soldering or welding.

Directly on top of the Si chip 16a is a first metal preform 22a and directly on top of the chip 16b is a second metal preform 22b. The metal preforms 22a, 22b may be made of the same material or of different materials, as indicated above. One or both metal preforms 22a, 22b may be attached to the respective chip 16a, 16b (by sintering, soldering or welding) and/or may be pressed against the respective chip 16a, 16b, for example against the respective electrode 20a, 20b.

A pressing force may be applied by an electrically conducting press pin 24a, 24b, which is pressed against the respective metal preform 22a, 22b. For example, the first and/or second press pin 24a, 24b may comprise a spring element 26a, 26b, which, for example, may comprise a disc spring. The metal preforms 22a, 22b, the press pins 24a, 24b and/or the spring elements 26a, 26b may be accommodated between the base plate 12 and the top plate 14.

The metal preforms 22a, 22b may be in electrical contact with the top plate, for example via the press pins 24a, 24b and/or via the spring elements 26a, 26b. In such a way, the two chips 16a, 16b are connected in parallel to each other, wherein there is a metal preform 22a, 22b in every current path.

The metal preform 22a is adapted for forming a conducting path through the Si chip 16a, when heated by an overcurrent. In such a way, a short circuit failure mode is provided, which forms a permanent conducting path to the Si chip 16a.

The metal preform 22b is adapted for forming an at least temporary conducting path through the wide bandgap material chip 16b, when heated by an overcurrent. In such a way, a short circuit failure mode is provided, which forms a temporary conducting path to the wide bandgap material chip 16b.

In combination, when a failure in the power semiconductor module 10 occurs, a current through the wide bandgap material chip 16b may form a temporary conducting path or even an open circuit. Simultaneously or after that, a conducting path may be formed through the Si chip 16a, which may provide a permanent short circuit failure mode for the semiconductor module 10. In such a way, a not so reliable short circuit failure mode for the wide bandgap material chip 16b may be supported by a more reliable short circuit failure mode provided by the Si chip 16a.

Since the melting point of Si may be lower than the melting point of the wide bandgap material (which is the case for SiC and most other wide bandgap materials), the first metal preform 22a may be made of a metal material with a lower melting point than the metal material of the second metal preform 22b. For example, the metal preform 22a may be made of Al and the metal preform 22b may be made of Mo.

In the case of Al, a very reliable short circuit failure mode may be provided, since Al may form an eutectic alloy with the Si material of the Si chip 16a.

The wide bandgap material chip 16b comprises a semiconductor switch 28b, which is controllable with a gate 30b. The wide bandgap material chip 16b may comprise a gate electrode 32b on the same side as the electrode 20b, which may be electrically connected, for example via a wire bond, with a gate terminal 34b of the semiconductor module 10. For example, the semiconductor switch 28b may be a SiC MOSFET. During a normal operation mode, the semiconductor switch 28b may be switched on and off with gate signals from a gate unit connected via the terminal 34b.

The Si chip 16a may be a functional or a dummy chip. As shown in FIG. 1, the Si chip 16a either may contain no semiconductor element at all or may contain a semiconductor element without a gate, such as a diode. It also may be that the Si chip 16a comprises a switch without a gate connection.

Figure 2:
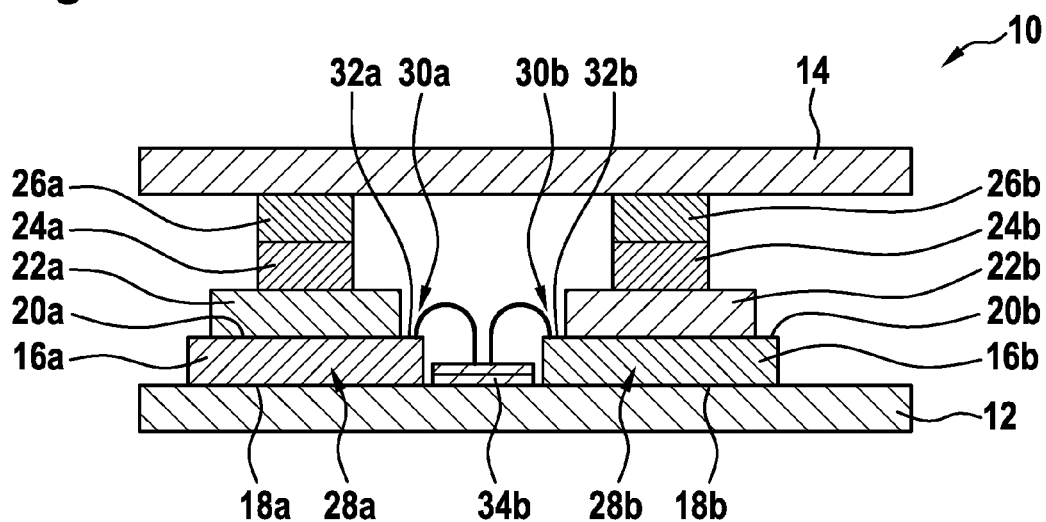
FIG. 2 schematically shows a cross-section through a power semiconductor module according to a further embodiment of the invention.
Figure 3:
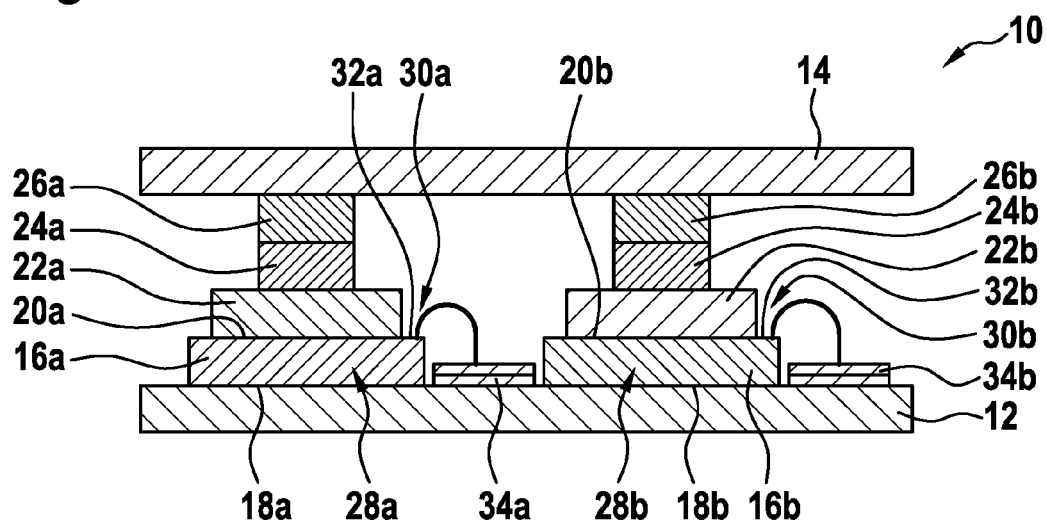
FIG. 3 schematically shows a cross-section through a power semiconductor module according to a further embodiment of the invention.

As shown in FIGS. 2 and 3, the Si chip 16a may comprise a semiconductor switch 28a, which is controllable with a gate 30a. The Si chip 16a may comprise a gate electrode 32a on the same side as the electrode 20a, which may be electrically connected, for example via a wire bond, with a first and/or second gate terminal 34a, 34b of the semiconductor module 10. For example, the switch 28a may be an IGBT or IGCT.

As shown in FIG. 2, the gate 30a of the Si chip 16a may be connected to the same gate terminal as the gate 30b of the wide bandgap chip 16b. In such a way, both switches 28a, 28b may be controlled with the same gate signal, which may be provided by the same gate unit. During a normal operation mode, both semiconductor switches 28b may be switched on and off with a gate signal from the same gate unit. During a failure operation mode, this gate unit also may provide a gate signal that forces the Si chip 16a to heat and to form a conducting path with the first metal preform 22a.

As shown in FIG. 3, the gate 30a of the Si chip 16a may be connected to a different gate terminal as the gate 30b of the wide bandgap chip 16b, such that the switches 28a, 28b may be controlled independently from each other. Two independent gate signals may be provided to the switches 28a, 28b, for example from the same or from two different gate units.

During normal operation mode, the switch 28b and optionally the switch 28a may be switched to control a current through the semiconductor module 10.

In a failure operation mode, the switch 28a may be controlled such that the Si chip 16a heats and forms a conducting path with the first metal preform 22a. For example, the gate signal may be such that the Si chip 16a has a resistance, which results in enough power to be converted to heat for melting the first metal preform 22a.

In general, the semiconductor module 10 shown in FIGS. 1 to 3 may be stacked with equally designed semiconductor modules 10 to form a high voltage switch, for example for AC-to-DC conversion in high voltage applications.

The following scenarios may happen when there is a failure in one of the chips 16a, 16b being part of a semiconductor module 10 connected in series with other semiconductor modules 10.

If the failure happens in the Si chip 16a first, the Si substrate will form a conducting path with the first metal preform 22a immediately after the failure as a high enough voltage across the chip 16a may be present, when the other semiconductor modules are conducting.

If the failure happens firstly in the wide bandgap chip 16b, an at least temporary SCFM (short circuit failure mode) formation may take place. A conducting path is formed by melting and reacting wide bandgap material and the second metal preform 22b.

A high resistance or open circuit after the wide bandgap chip 16b has failed, for example, because the conducting path in the wide bandgap chip 16b has not formed or has a too high resistance, may result in a passively forced Si SCFM formation. A following voltage spike will form a safe conducting path through the Si chip 16a as described above.

Furthermore, a transition from a SCFM conducting path provided though the wide bandgap chip 16b to a Si SCFM conducting path through the Si chip 16a may be possible. The conducting path formed through the wide bandgap material may withstand the full current load only for a short period, the resistance may increase or may lead to an open circuit. Then a transition to a conducting path through the Si chip 16a may be formed as described above. This may extend the lifetime of the SCFM mode of the semiconductor module 10.

Additionally, for the embodiment shown in FIG. 3, a separate gate unit may turn on the switch 28a to conduct the full load current immediately after the failure and/or to actively force a SCFM formation.

Figure 4:
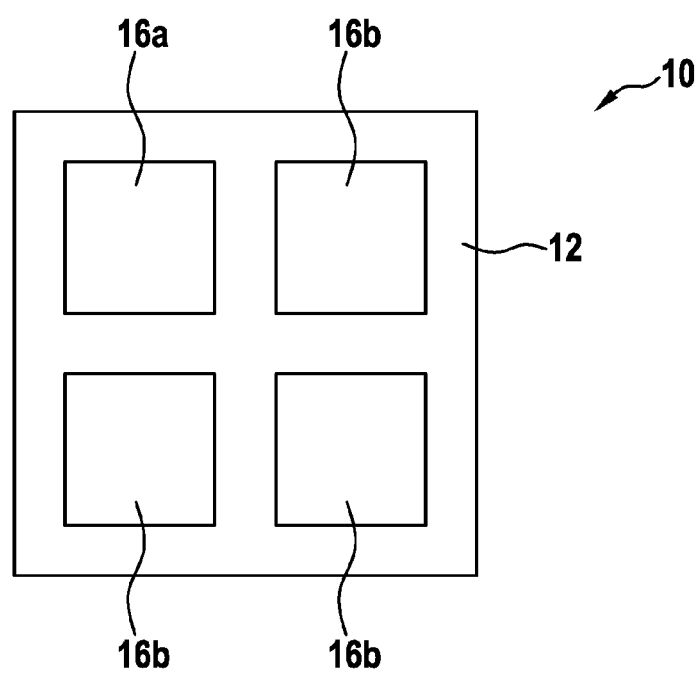
FIG. 4 schematically shows a top view of a power semiconductor module according to a further embodiment of the invention.

FIG. 4 shows that one Si chip 16a is combined with more than one wide bandgap material chip 16b in one semiconductor module 10. In such a way, a short circuit failure mode may be provided for more than one wide bandgap material chip 16b by only one Si chip 16a. All the chips 16a, 16b in FIG. 4 may be provided with metal preforms 22a, 22b and press pins 24a, 24 as shown in FIGS. 1 to 3. Furthermore, the gates 30a, 30b may be connected as shown in FIG. 1 to FIG. 3, wherein the gates 30b of the switches 28b provided by the wide bandgap material chip 16b may be connected in parallel to the same second terminal 34b.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art and practising the claimed invention, from a study of the drawings, the disclosure, and the appended claims. In the claims, the word "comprising" does not exclude other elements or steps, and the indefinite article "a" or "an" does not exclude a plurality. A single processor or controller or other unit may fulfil the functions of several items recited in the claims. The mere fact that certain measures are recited in mutually different dependent claims does not indicate that a combination of these measures cannot be used to advantage. Any reference signs in the claims should not be construed as limiting the scope.

LIST OF REFERENCE SYMBOLS 10 power semiconductor module
12 base plate
14 top plate
16a first, Si chip
16b second, wide bandgap material chip
18a first bottom electrode
18b second bottom electrode
20a first top electrode
20b second top electrode
22a first metal preform
22b second metal preform
24a first press pin
24b second press pin
26a first spring element
26b second spring element
28a first semiconductor switch
28b second semiconductor switch
30a first gate
30b second gate
32a first gate electrode
32b second gate electrode
34a first gate terminal
34b second gate terminal

The invention claimed is:

1. A power semiconductor module, comprising:
a base plate;
a Si chip comprising a Si substrate, the Si chip attached to the base plate;
a first metal preform pressed with a first press pin against a side of the Si chip;
a wide bandgap material chip comprising a wide bandgap substrate and a semiconductor switch provided in the wide bandgap substrate, the wide bandgap material chip attached to the base plate;
a second metal preform pressed with a second press pin against a side of the wide bandgap material chip;
wherein the Si chip and the wide bandgap material chip are connected in parallel via the base plate and via the first press pin and the second press pin;
wherein the first metal preform is adapted for forming a conducting path through the Si chip by forming an alloy with the Si substrate, when heated by an overcurrent;
wherein the second metal preform, which is made of a material with a higher melting point as a material of the first metal preform, is adapted for forming an at least temporary conducting path through the wide bandgap material chip, when heated by an overcurrent.

2. The power semiconductor module of claim 1, wherein the second metal preform is adapted for forming an at least temporary conducting path through the wide bandgap material chip by at least partially being melted by the overcurrent.

3. The power semiconductor module of claim 1, wherein the first metal preform is made of Al, Cu, Ag, Mg or an alloy thereof.

4. The power semiconductor module of claim 1, wherein the second metal preform is made of Mo, W or an alloy thereof.

5. The power semiconductor module of claim 1, wherein the base plate is made of Mo.

6. The power semiconductor module of claim 1, wherein the wide bandgap material of the wide bandgap material chip is SiC.

7. The power semiconductor module of claim 1, wherein the Si chip comprises a semiconductor switch provided in the Si substrate.

8. The power semiconductor module of claim 7, wherein a gate of the semiconductor switch of the Si chip is electrically connected in the semiconductor module with a gate of the semiconductor switch of the wide bandgap material chip.

9. The power semiconductor module of claim 7, wherein a gate of the semiconductor switch of the Si chip is electrically connected to a first gate terminal of the semiconductor module and a gate of the semiconductor switch of the wide bandgap material chip is electrically connected to a second gate terminal of the semiconductor module, such that the semiconductor switch of the Si chip is switchable independently of the semiconductor switch of the wide bandgap material chip.

10. The power semiconductor module of claim 7, wherein a gate of the semiconductor switch of the Si chip is not connected to a gate terminal provided by the semiconductor module.

11. The power semiconductor module of claim 1, wherein the Si chip does not comprise an active switchable switch.

12. The power semiconductor module of claim 1, wherein the Si chip is a passive Si layer.

13. The power semiconductor module of claim 1, wherein the power semiconductor module comprises at least two wide bandgap material chips connected in parallel with the Si chip.

14. The power semiconductor module of claim 1, further comprising:
an electrically conducting top plate connected to the first press pin and the second press pin.

15. The power semiconductor module of claim 1, wherein at least one of the first press pin and the second press pin comprises a spring element.

16. The power semiconductor module of claim 2, wherein the first metal preform is made of Al, Cu, Ag, Mg or an alloy thereof.

17. The power semiconductor module of claim 1, wherein the second metal preform is made of Mo, W or an alloy thereof; and wherein the base plate is made of Mo.

18. The power semiconductor module of claim 2, wherein the wide bandgap material of the wide bandgap material chip is SiC.

19. The power semiconductor module of claim 2, wherein the Si chip comprises a semiconductor switch provided in the Si substrate.

20. The power semiconductor module of claim 17, wherein the wide bandgap material of the wide bandgap material chip is SiC.

* * * * *